United States Patent [19]

Klimanis et al.

[11] Patent Number: 5,257,227
[45] Date of Patent: Oct. 26, 1993

[54] BIPOLAR FET READ-WRITE CIRCUIT FOR MEMORY

[75] Inventors: Vilnis Klimanis; Frank A. Montegari, both of Wappingers Falls, N.Y.

[73] Assignee: International Business Machines Corp., Armonk, N.Y.

[21] Appl. No.: 640,275

[22] Filed: Jan. 11, 1991

[51] Int. Cl.$^5$ .............................................. G11C 11/40
[52] U.S. Cl. ..................... 365/190; 365/177; 365/189.06
[58] Field of Search ................ 365/190, 177, 225.6, 365/189.06

[56] References Cited

U.S. PATENT DOCUMENTS

| | | | |
|---|---|---|---|
| 4,616,342 | 10/1986 | Miyamoto | 365/190 |
| 4,665,505 | 5/1987 | Miyakawa et al. | 365/177 |
| 4,730,279 | 3/1988 | Obtani | 365/203 |
| 4,821,237 | 4/1989 | Iwahashi | 365/189 |
| 4,825,413 | 4/1989 | Tran | 365/189 |
| 4,829,479 | 5/1989 | Mitsumoto et al. | 365/189.09 |
| 4,839,862 | 6/1989 | Shiba et al. | 365/154 |
| 4,862,421 | 8/1989 | Tran | 365/189.07 |
| 4,866,674 | 9/1989 | Tran | 365/189.11 |
| 4,961,168 | 10/1990 | Tran | 365/190 X |
| 4,984,196 | 1/1991 | Tran et al. | 365/177 X |
| 5,058,067 | 10/1991 | Kertis | 365/189.06 X |
| 5,079,744 | 1/1992 | Tobita et al. | 365/190 X |
| 5,091,879 | 2/1992 | Tran | 365/190 X |
| 5,117,391 | 5/1992 | Hwang et al. | 365/190 X |

Primary Examiner—Eugene R. LaRoche
Assistant Examiner—Do Hyun Yoo
Attorney, Agent, or Firm—Perman & Green

[57] ABSTRACT

A circuit for accessing a column of memory cells in an array of memory cells includes a pair of drivers for activating bit lines for writing data into a selected cell in the column of cells. Each driver includes a bipolar transistor operated with current and voltage applied to a base terminal thereof by a pair of field-effect transistors (FETs) wherein one of the transistors effectively shorts the base terminal to an emitter terminal for elimination of current flow during a state of nonconduction, this FET being overridden by a second FET which applies base current during a state of conduction during writing of the cell. The second FET in each driver is activated by a column address signal applied to a drain terminal thereof, and by a data input signal applied to a gate terminal of the FET to provide for writing during concurrence of the two signals. In the presence of only the column access signal, two sense transistors in branches of a cascode circuit are rendered operative by the column access signal for reading a selected signal. In the absence of both the column access and the data input signals, a restore circuit equalizes voltages of the bit lines, and sets the voltages at a level established by the threshold of an FET having its gate terminal shorted to its drain terminal.

9 Claims, 3 Drawing Sheets

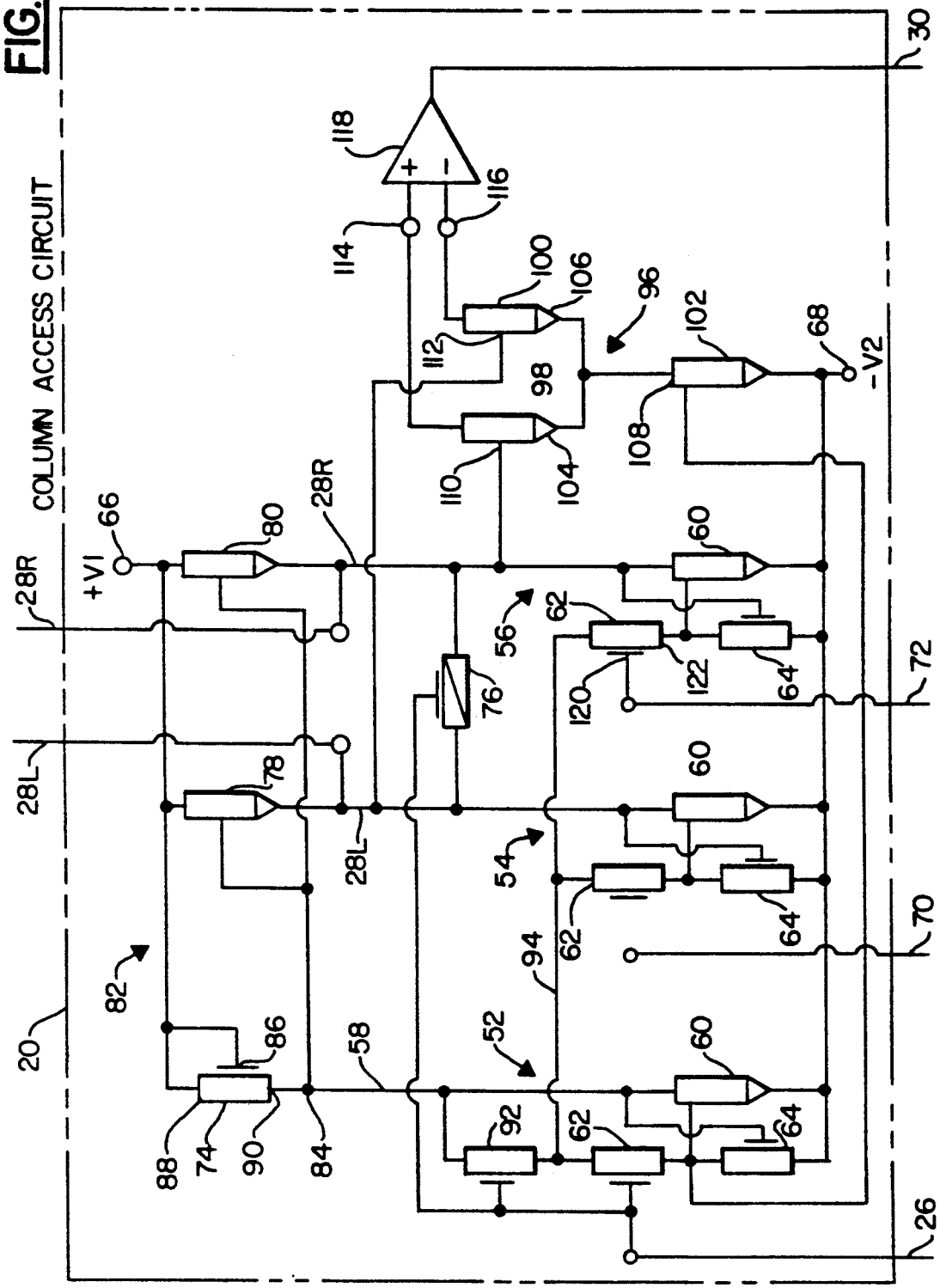

BIPOLAR FET READ-WRITE CIRCUIT FOR MEMORY

BACKGROUND OF THE INVENTION

This invention relates to operation of a memory having an FET memory cell accessed by a pair of complementary bit lines and, more particularly, to a circuit incorporating both bipolar transistors and field-effect transistors connected to the complementary bit lines for providing functions of writing, reading, and restoration of the bit-line voltage in response to a set of logic signals.

A memory for a digital computer or data processing equipment, such as a random-access memory, is composed of an array of memory cells, arranged typically in rows and columns, addressed by signals on word lines and bit lines. The bit lines of a column of cells serve as a common port by which the cells in the column are accessed for reading or writing via a common port. By way of example, the memory element of a cell may comprise a bistable flip-flop circuit wherein the state of the flip flop may be sensed for reading stored data and altered for writing new data, the sensing and the altering being accomplished, respectively, by a sensing of voltage and application of current to terminals of the common port.

In the case of a memory formed of a bank of memory cells, an individual one of the cells is addressed for the reading or writing of the cell. Due to the sharing of a common port by many cells, internal wiring of the memory provides for communication of signals between the cells of a column and the common port. There is a propagation delay during communication of the signal between an addressed cell and the port. The amount of delay can be reduced by reducing the physical size of the memory, as well as by restoring the voltage at each terminal of the common port to an equal value, and to a voltage level between those of a logic-1 signal and a logic-0 signal. This reduces the transient response in altering the logic state of the port upon the reading of new data from a memory cell, and thereby reduces the propagation delay.

In order to reduce the physical size of the memory, it is preferable to employ field-effect transistors (FETs) because the physical construction of an FET occupies less space than does the physical size of a bipolar transistor. However, the bipolar transistor has a faster dynamic response. Accordingly, in order to take advantage of both forms of transistors, it is advantageous to construct the semiconductor circuit for control of the memory by use of both bipolar transistors and FETs. Furthermore, in order to reduce the average power dissipation within the memory cell, so as to reduce cooling requirements and permit more dense packaging of the memory cells, complementary circuits of FETs may be employed, so called CMOS (complementary metal-oxide semiconductor) FETs. Complementary FET circuits have significant power flow only during a transition state of an FET, with virtually no power being expended during the remainder of the operating time of the FET circuit.

It is to be noted that the term MOS refers to a specific structure of an FET employing a metal oxide as was a common practice, and that today other forms of construction are also employed and may be preferred. Therefore, herein, only the terms FET (or field effect transistor) and bipolar transistors are used to describe the transistors of interest herein, and a circuit employing both kinds of transistors may be referred to as a BiFET circuit.

A problem arises that, in the use of both FETs and bipolar transistors in a circuit, the advantage of low power dissipation is lost to some extent because the current may flow in a bipolar transistor both during transitions in the current state of the transistor, as well as during operation of the transistor between the transitions in current state. Thus, the bipolar transistor is dissipating power continuously. As a result, in presently available circuitry, a compromise must be made between the enhanced dynamic response provided by a bipolar transistor and the disadvantageous increased power dissipation.

SUMMARY OF THE INVENTION

The aforementioned problem is overcome and other advantages are provided by a semiconductor memory circuit employing both bipolar transistors and field-effect transistors for operation of a memory having at least one memory cell, typically many memory cells with access to the cells being provided by a pair of terminals of a common port. The pair of terminals carries complementary logic signals. In accordance with a feature of the invention, the memory circuit includes a pair of write circuits connected to a selected memory cell via the pair of terminals of the common port. Each of the write circuits is provided with a bipolar transistor having a collector terminal thereof connected via a bit line to a terminal of the memory cell. Furthermore, in order to provide for the advantage of essentially zero current flow through the bipolar transistor during intervals of time between transitions of logic current state, each write circuit is provided with an FET base-drive circuit comprising two FETs connected to a base terminal of the bipolar transistor. In each base drive circuit, a first of the two FETs is connected via its drain terminal to an activation signal line to apply base current to the bipolar transistor for placing the bipolar transistor in a state of conduction for writing a memory cell. A gate terminal of the first FET serves as an input command terminal for receipt of a data input signal to activate a bit line for writing the memory cell. Concurrent energization of the activation signal line and the data input signal to the base drive circuit activates the bit line for writing a memory. The second of the two FETs of the base drive circuit is connected between the base terminal and an emitter terminal of the bipolar transistor for effectively shorting the base and the emitter terminals to terminate conduction of current in the bipolar transistor. The operation of the first FET overpowers the operation of the second FET when it is desired to write the memory cell.

The semiconductor memory circuit, in accordance with a further feature of the invention, further comprises restore circuitry comprising a type-P FET connected between the bit lines of the common port, and a pair of bipolar transistors connected between a power supply line and respective ones of the bit lines. The bipolar transistors and the type-P FET of the restore circuitry are activated concurrently with an inversion of the activation signal for applying current to the bit lines and for equalizing voltages of the bit lines.

Sensing circuitry for reading the logic signals outputted by the memory cells at the terminals of the common port is provided in the form of a cascode circuit employing three bipolar transistors. In the sensing circuitry, one of the bipolar transistors serves as a current source of the cascode circuit and is energized concurrently with the activation signal. The remaining two bipolar transistors of the sensing circuit form branches of the cascode circuit and are connected via their base terminals to respective ones of the bit lines for outputting a pair of signals wherein the differential voltage between the two signals represents the state, logic-1 or logic-0, of the data being read out of the selected memory cell.

BRIEF DESCRIPTION OF THE DRAWING

The aforementioned aspects and other features of the invention are explained in the following description, taken in connection with the accompanying drawing wherein:

FIG. 3 is a schematic diagram of the circuit of the invention for reading, writing, and restoring a memory cell of the system of FIG. 1.

DETAILED DESCRIPTION

Figure 1:
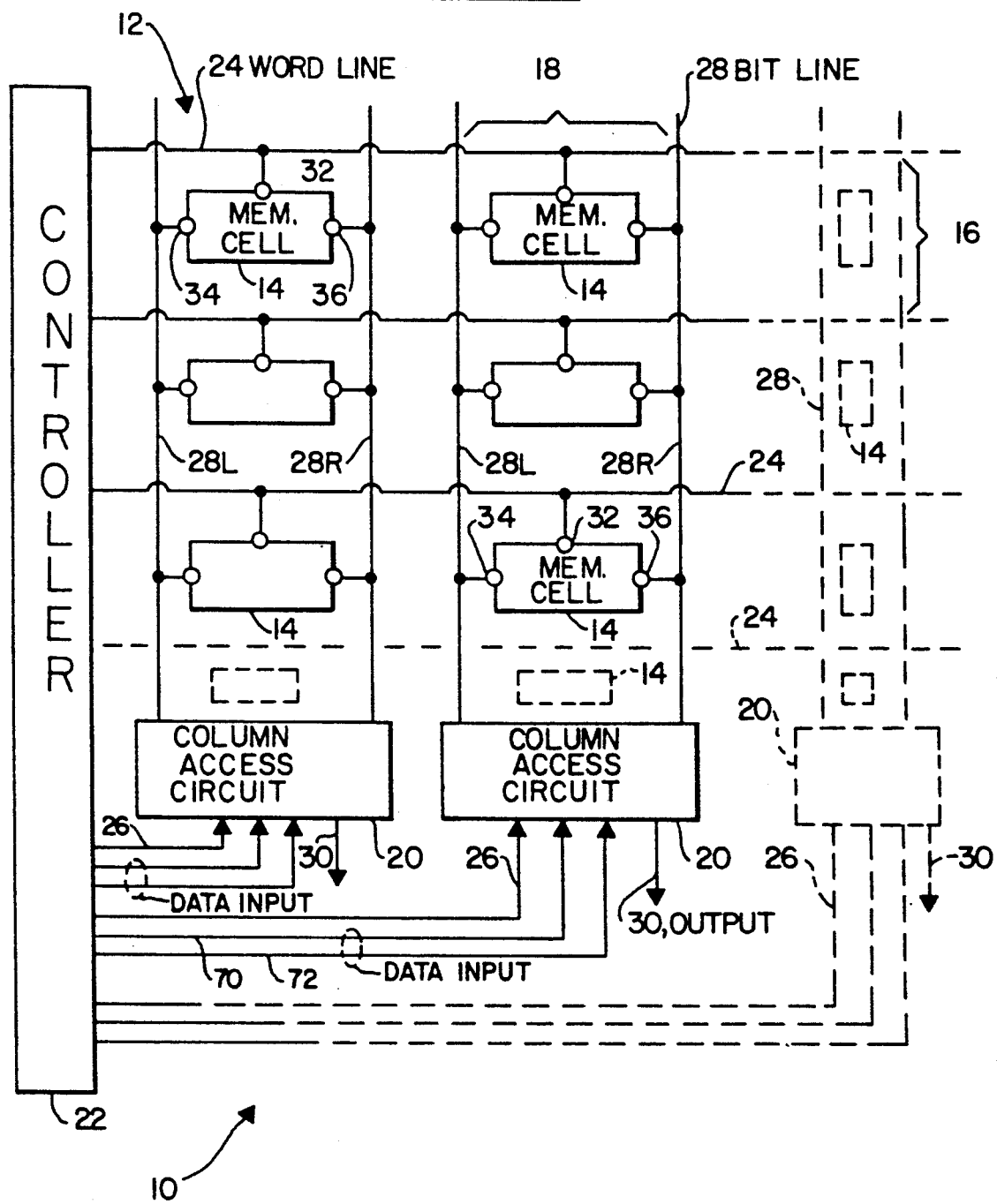
FIG. 1 is a diagrammatic view of a memory system including an array of memory cells, and incorporating circuitry of the invention for accessing a selected cell.

FIG. 1 shows a memory system 10 having an array 12 of memory cells 14 arranged in rows 16 and columns 18. Included within the memory system 10 are a set of column access circuits 20 embodying the invention, and a memory controller 22, there being one access circuit 20 for each of the columns 18. The memory controller 22 outputs a row address on one of a set of word lines 24 and a column address on one of a set of column access lines 26 for addressing a specific one of the memory cells 14 to be read or written. Each column access line 26 activates a separate one of the column access circuits 20. A pair of bit lines 28 is provided for each of the column access circuits 20, the pairs of bit lines 28, connecting the column access circuits 20 to the memory cells 14 of the respective columns 18. For ease of reference, it is convenient to identify further the bit lines 28 to distinguish a left bit line 28L on the left side of the memory cells 14 of the column 18 from a right bit line 28R on the right side of the memory cells 14 of the column 18. Data read out of a cell 14 from any one of the columns 18 is outputted along an output data line 30 from the corresponding column access circuit 20. A word line 24 connects with a memory cell 14 via a terminal 32 the left bit line 28L connecting via terminal 34 to the cell 14, and the right bit line 28R of a column 18 connecting via a terminal 36 to the cell 14. The controller 22 also applies input data signals via a pair of input data lines to each of the column access circuits 20 for activation of a left bit line 28L or a right bit line 28R as will be described hereinafter.

Figure 2:
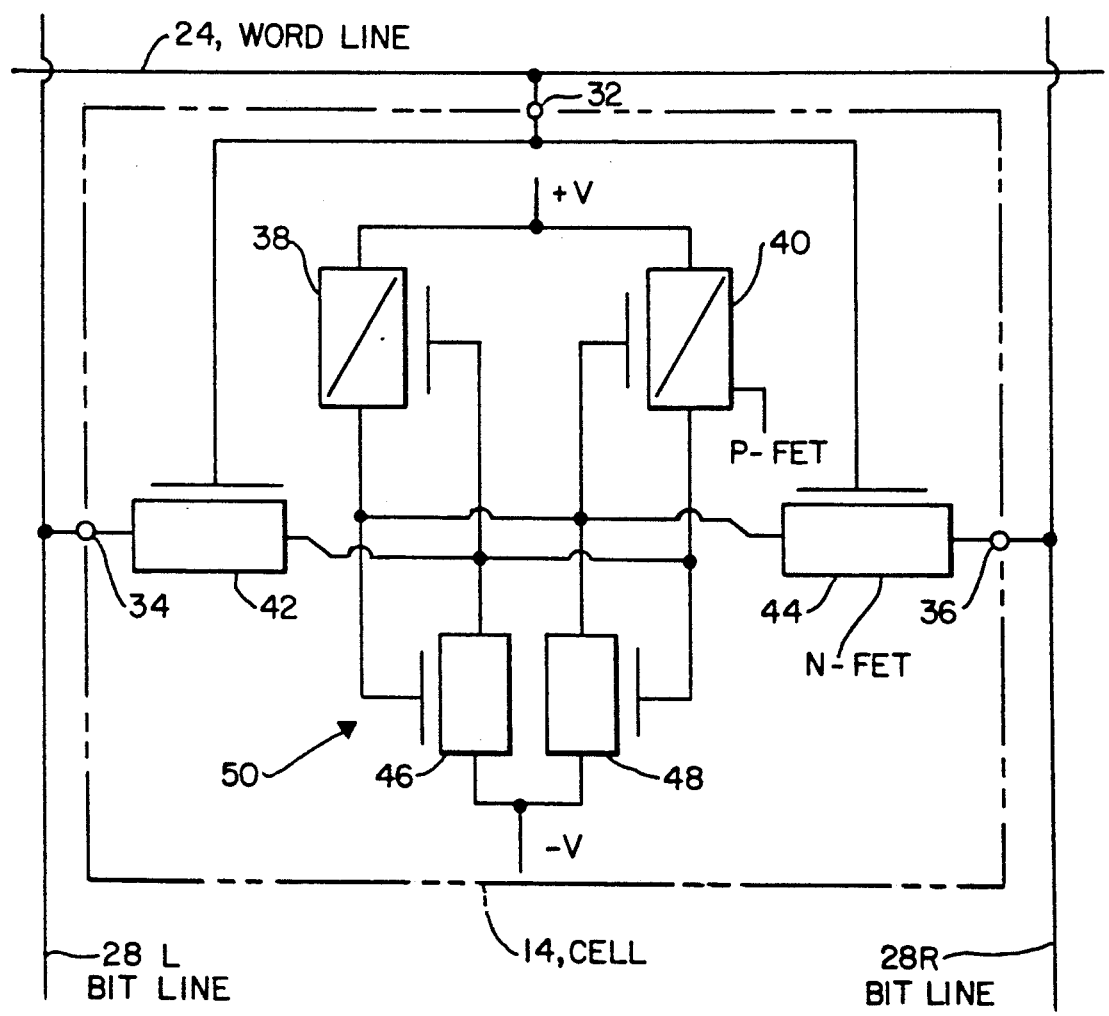
FIG. 2 shows schematically a memory cell of the system of FIG. 1.

FIG. 2 shows details in a construction of one of the memory cells 14 of FIG. 1, each of the cells 14 having the same construction. Included within FIG. 2 are connections to the cell 14 of the word line via terminal 32, the bit line 28 L via terminal 34, and the bit line 28R via terminal 36. The principles of the invention are applicable to memory cells constructed in a variety of ways, the description of FIG. 2 applying to a specific construction of memory cell, presented by way of example, in conjunction with a preferred embodiment of the invention. The cell 14 comprises two type-P FETs 38 and 40, and four type-N FETs 42, 44, 46, and 48. The interconnection and operation of the FETs 38-48 of the cell 14 are well known, and accordingly, is reviewed here only briefly. The FETs 46 and 48 have their gate and drain terminals interconnected to form a bistable flip-flop 50. The FETs 38 and 40 connect with the FETs 46 and 48 to stabilize the two alternate states of the flip-flop 50. The source and gate terminals of the FET 38 connect respectively with the gate and drain terminals of the FET 46 and with the drain and the gate terminals of the FET 48. Similarly, the source and the gate terminals of the FET 40 connect respectively with the gate and the drain terminals of the FET 48 and with the drain and the gate terminals of the FET 46. The FETs 42 and 44 serve as transfer or pass devices for coupling signals between the bit lines 28L and 28R, respectively, to the cell 14.

The gate terminals of the FETs 42 and 44 connect via terminal 32 of cell 14 to the word line 24. Via the source and the drain terminals of the FET 42, there is connection of the left bit line 28L to the gate terminal of the FET 38. Via the source and the drain terminals of the FET 44, there is connection of the right line 28R to the gate terminal of the FET 40. The configuration of the four FETs 38, 40, 46, and 48 connects between two sources of voltage, the higher (more positive) of the two voltage sources being indicated by +V and the lower (more negative) of the two voltage sources being indicated by −V. A relatively high voltage on the word line 24 places each of the FETs 42 and 44 in a state of conduction to allow a sensing of voltage at the drain terminals of the FETs 46 and 48 for reading the contents of the cell 14, and for applying sufficient voltage to the gate of the FET 48 or the FET 46 to set the flip-flop 50 to a desired state during a writing of the cell 14.

FIG. 3 shows details in the construction of the column access circuit 20, including the connections of the circuit 20 to the bit lines 28L and 28R, the column access line 26, and the data line 30 which have been described previously with reference to FIG. 1. In accordance with a feature of the invention, the access circuit 20 comprises three BiFET (bipolar FET) drivers 52, 54, and 56 for driving current, respectively, on lines 58, 28L, and 28R. Each of the drivers 52, 54, and 56 has the same construction, and comprises an NPN bipolar transistor 60 and two type-N FETs 62 and 64. Electrical components of the access circuit 20, including the components of the drivers 52, 54, and 56 are powered electrically from a power supply having terminals 66 and 68 wherein the terminal 66 provides a positive voltage +V1 and the terminal 68 provides a negative voltage −V2. The driver 54 is activated by a relatively high logic-1 signal on input data line 70 (shown also in FIG. 1) for drawing current via the bit line 28L from a selected memory cell 14 for writing the cell 14. The driver 56 is activated by a relatively high logic-1 signal on input data line 72 (shown also in FIG. 1) for drawing current via the bit line 28R from a selected memory cell 14 for writing the cell 14.

The access circuit 20 further comprises a type-N FET 74, a type-P FET 76, and two NPN bipolar transistors 78 and 80 which constitute a restore circuit 82 for equalizing voltages on the bit line 28L and 28R prior to a reading of the data stored in the memory cell 14. The driver 52 is responsive to a relatively high logic-1 signal on the column access line 26 for drawing current from line 58 and lowering the voltage at node 84 for deactivating the transistors 78 and 80 subsequent to a restore operation. The logic-1 signal on line 26 also deactivates the FET 76 upon completion of the restore operation. In the FET 74, the gate terminal 86 is connected to the drain terminal 88 to establish a threshold voltage for initiating current between the source terminal 90 and the drain terminal 88 of approximately 0.3 volts. During conduction of current to the FET 74, there is a substantially linear relationship between the voltage drop and the magnitude of current between the drain and the source terminals. Thus, the FET 74 functions to provide an offset resistive voltage drop, the offset being the threshold voltage. The use of the FET 74 in this fashion aids in establishing an operating point for the base voltage applied to the transistors 78 and 80 in accordance with a feature of the invention.

The three drivers 52, 54, and 56 are activated concurrently by a logic-1 signal on the access line 26 via an FET 92, line 26 connecting with a gate terminal of the FET 92. The drain terminal of the FET 92 is connected to line 58 and the source terminal of the FET 92 is connected via a driver activation line 94 to each of the drivers 52, 54, and 56. Sensing and reading of data in a selected memory cell 14 connected to the bit lines 28 is provided by a cascode circuit 96. The cascode circuit 96 comprises three NPN bipolar transistors 98, 100, and 102 wherein emitter terminals 104 and 106, respectively, of the transistors 98 and 100 are connected together and to the collector terminal 108 of the transistor 102. The base terminal 110 of the transistor 98 is connected to the right bit line 28R, and the base terminal 112 of the transistor 100 is connected to the left bit line 28L. Collector terminals of the transistors 98 and 100 are connected, respectively, to terminals 114 and 116 for providing a differential voltage representing a logic-1 or logic-0 stored in the selected memory cell 14. Alternatively, if desired, the signals at a terminal 114 and 116 may be applied to the positive and the negative input terminals of a differential amplifier 118 which outputs a relatively high voltage, or logic-1, signal on the output data line 30 in response to the reading of a voltage on bit line 28R which is higher than the voltage on bit line 28L. In corresponding fashion, the amplifier 118 outputs a relatively low voltage, or logic-0, signal in response to the reading of a voltage on bit line 28L which is positive with respect to a voltage on bit line 28R. The base terminals of the transistors 102 and 60 are connected together for concurrent activation by the column address signal on the column access line 26 via the FET 62 in the driver 52.

In each of the drivers 52, 54, and 56, the FET 62 provides base current to the transistor 60 upon application of a positive voltage to the gate terminal 120 of the FET 62 relative to the source terminal 122 thereof. The junction of the source terminal of the FET 62 with the drain terminal of the FET 64 connects with the base terminal of the transistor 60. The source terminal of the FET 64 connects with the emitter terminal of the transistor 60, and the gate terminal of the FET 64 connects with the collector terminal of the transistor 60. Thereby, during periods of deactivation of the FET 62, the voltage applied by the collector terminal of the transistor 60 to the gate terminal of the FET 64 activates the FET 64 to reduce the voltage between the base and the emitter terminals of the transistor 60 to a sufficiently small value for terminating a state of conduction on the transistor 60. Activation of the FET 62 overpowers the operation of the FET 64 to place the transistor 60 in a state of conduction. Logic-1 signals for activation of the FET 62 in drivers 52, 54, and 56 are provided on lines 26, 70 and 72, respectively.

In operation, reading and writing is accomplished by application of suitable voltage levels to the column access line 26 and the two data input lines 70 and 72. It is noted that the high voltage on line 26 acts upon the driver 52 by raising the base voltage of transistor 60 via FET 62, and the collector voltage of transistor 60 via the FET 92 relative to the voltage level at terminal 68 which is connected to the emitter terminal of transistor 60. Also, by virtue of the interconnection of the base terminals of the transistor 60 of the driver 52 and the transistor 102, the high voltage on the access line 26 also activates the transistor 102 to act as a current source in the cascode circuit 96 for drawing current through either one of the transistors 98 and 100 depending on which of the two transistors 98 and 100 has the higher base voltage.

In the driver 54, a high voltage is required on both the access line 26 and the data input line 70 in order to place a transistor 60 in a state of conduction. The high voltage on line 26 activates the transistor 92 to draw current from the power supply terminal 66 via the FET 74 to raise the voltage level at the drain terminal of the FET 62 while the gate terminal thereof is raised in voltage by the signal on line 70. If either of the voltages on line 26 or line 70 is low, then the transistor 60 of the driver 54 is in a state of nonconduction. Similar comments apply to the operation of the driver 56 with respect to activation of the transistor 60 such that, in the presence of the high voltage on both the access line 26 and the data input line 72, the transistor 60 is placed in a state of conduction. However, in the event that a low voltage is present on either one of the lines 26 and 72, the transistor 60 of the driver 56 is placed in a state of nonconduction. The process of writing a logic-1 signal to the memory cell 14 via bit line 28L in conjunction with a writing of a logic-0 to the cell 14 via bit line 28R is accomplished by raising the voltage of the access line 26 and the voltage of the data input lines 70 while lowering the voltage of the data input line 72. Reversing the logic states of the signals on the data input lines 70 and 72 with a high signal on access line 26 provides for writing cell 14 with a logic-1 at bit line 28R and a logic-0 at bit line 28L.

The reading of data in the memory cell 14 is accomplished by placing the high voltage on the access line 26 while a low voltage is placed on both of the data input lines 70 and 72. The transistors 60 in both of the drivers 54 and 56 are in a state of nonconduction with the result that any current flow through the memory cell 14, as in the case of the sensing of the state of the data stored in the cell 14, flows via a bit line 28 to the base terminal of one of the transistors 98 or 100 of the cascode circuit 96, and via the current source 102 to the power supply terminal 68. As noted hereinabove, the current source of the transistor 102 of the cascode circuit 96 is activated in the presence of the high voltage on the access line 26. Thereby, in the presence of the high voltage in the access line 26, application of a high voltage to either one of the data input lines 70 and 72 introduces the write mode of operation while application of a low voltage to both of the data input lines 70 and 72 introduces the read mode of operation.

During either the write or read modes of operation, the voltage on the gate terminal of the type-P FET 76 is high placing the FET 76 in a state of nonconduction. Thereby, the bit lines 28L and 28R are free to assume different voltage levels to permit either the writing or the reading mode of operation. In the presence of the low voltage on the access line 26, reading and writing are inhibited, but the restore mode of operation is activated. The transistor 60 in the driver 52 is in a state of nonconduction, the FET 92 also being in a state of nonconduction, with the result that essentially no current floss in the line 58, and voltage at the node 84 rises to the threshold level at the FET 74. Therefore, in the restore mode of operation, the transistors 78 and 80 are placed in states of conduction by virtue of the positive voltage at their respective base terminals relative to their respective emitter terminals. At the inception of the restore mode, the transistors 78 and 80 act as emitter followers to drive current into the bit lines 28L and 28R to charge capacitance of these lines and of the input terminals to the many memory cells 14 (typically a few hundred memory cells) in a column 18 (FIG. 1). Upon a charging of the line capacitance, the voltages on the bit lines 28L and 28R rise sufficiently to decrease the base-emitter voltage drop of each of the transistors 78 and 80 to terminate conduction of these transistors. A typical value of threshold voltage drop between the base terminal and the emitter terminal of each of the transistors 78 and 80 is approximately 0.8 volts for initiation of conduction. The charging of the line capacitance of each of the bit lines 28 by the transistors 78 and 80, and the equalization of the voltages of the bit lines 28L and 28R by the FET 76 completes the restore process and readies the common port, represented by the bit lines 28L and 28R, of the column of memory cells 14 for a subsequent read out of data from a selected one of the cells 14 via the cascode circuit 96.

A feature in the operation of the invention is the setting of the base voltages of the transistor 78 and 80 relative to the power supply terminal 66, the latter being coupled to the collector terminals of the resistors 78 and 80 by means of the threshold voltage of the FET 74. During the latter stage of the restore process, upon termination of the currents in the transistor 78 and 80, the resultant voltage on each of the bit lines 28L and 28R is dependent on the threshold voltage of the FET 74. By using the aforementioned values of voltage, the bit line voltage is 0.8 volts negative relative to the bas voltage of each of the transistors 78 and 80, the base voltage being negative relative to the power supply terminal 66 by 0.3 volts, the latter being the threshold voltage of the FET 74. This places the bit-line voltage at a sum of the two voltages, namely 1.1 volts, negative relative to the voltage at the supply terminal 66 for the case of minimal current flow in the transistors 74, 78 and 80. Measured bit-line voltage with actual operating current in the FET 74 is approximately 1.5 volts negative relative the power supply terminal 66. The bit-line voltage drops an additional 2.0 volts, approximately, upon activation of a transistor 60 of a driver 54 or 56.

By way of example in the construction of a preferred embodiment of the invention, the voltage at the supply terminal 66 is +1.4 volts, and the voltage at the power supply terminal 68 is −2.2 V. As is well known, a threshold voltage of an FET, such as the FET 74, can be selected during the manufacturing process by appropriate selection of the dimensions of doped regions at the various junctions of the FET. Also, since the physical structure of an FET is smaller than that of a resistor in the fabrication of circuit elements of a semiconductor chip, the use of the FET 74 reduces the physical size of a circuit component and also reduces the complexity of the circuitry, thereby reducing the number of components. Also, with respect to the drivers 52, 54, and 56, by the construction of each of the drivers with identical circuit configurations, a transistor 60 of the drivers 54 and 56, and also the transistor 102 may be regarded as a current mirror of the transistor 60 of the driver 52, with each of these transistors providing the same current during their respective states of activation. A suitable value of low voltage for any one of the lines 26, 70, and 72 is −2.0 V.

During states of conduction of the transistors 60 of the driver 54 and 56, each of these transistors lowers the corresponding bit lines 28L and 28R to a voltage of −2.0 V, this voltage being limited by a clamping action of the transistors 78 and 80 which automatically assume a conduction mode upon a lowering of their respective emitter voltages relative to the voltages at node 84.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A semiconductor memory circuit comprising
   a memory cell having a pair of complementary cell terminals for accessing the cell;
   a first write circuit having a bipolar transistor connected to a first of said cell terminals for driving electric current through said first cell terminal;
   a second write circuit having a bipolar transistor connected to a second of said cell terminal, each of said write circuits further including an FET base drive circuit comprising two field-effect transistors connected serially to each other via a junction point and connected via said junction point to a base terminal of said bipolar transistor, a first of said field-effect transistors serving to place said bipolar transistor in a state of conduction, and the second of said field-effect transistors connecting with an emitter terminal of said bipolar transistor and serving to place said bipolar transistor in a state of nonconduction;
   a first control terminal for applying an activation signal to said first field-effect transistor in each of said base drive circuits, the gate terminal of said first field-effect transistor in the first of said write circuits serving as a first write terminal, the gate terminal of said first field-effect transistor in the second of said write circuits serving as a second write terminal; and
   wherein application of said activation signal to said control terminal concurrently with application of complementary logic signals to said first and said second write terminals accomplishes a writing of data into said memory cell.

2. A memory circuit according to claim 1 further comprising a restore circuit having a pair of restore bipolar transistors connected between a source of power and respective ones of said cell terminals, said restore circuit further comprising a biasing field-effect transistor connected from said source of power to a base terminal in each of said restore bipolar transistors for biasing said restore bipolar transistors during a restoring of voltage between the two cell terminals; and
   wherein each of said bipolar transistors of said restore circuit is connected to said first control terminal to be placed in a state of conduction during an inverted state of the activation signal.

3. A memory circuit according to claim 2 wherein said restore circuit further comprises equalizing means coupled between said cell terminals for equalizing their voltages; said equalizing means being a type-P FET activated by the inverted state of the activation signal.

4. A memory circuit according to claim 1 further comprising a sensing circuit having a cascode circuit including a pair of bipolar transistors coupled via their base terminals to respective ones of the cell terminals, the cascode circuit including a current-source bipolar transistor, the current-source bipolar transistor being connected via its base terminal to said first control terminal to be activated to provide sensing of data of the memory cell in response to the activation signal.

5. A memory circuit according to claim 4 further comprising a restore circuit having a pair of restore bipolar transistors connected between a source of power and respective ones of said cell terminals, said restore circuit further comprising a biasing field-effect transistor connected from said source of power to a base terminal in each of said restore bipolar transistors for biasing said restore bipolar transistors during a restoring of voltage between the two cell terminals; and wherein each of said bipolar transistors of said restore circuit are connected to said first control terminal to be placed in a state of conduction during an inverted state of the activation signal.

6. A memory circuit according to claim 5 wherein said restore circuit further comprises equalizing means coupled between said cell terminals for equalizing their voltages; said equalizing means being a type-P FET activated by the inverted state of the activation signal.

7. A memory circuit according to claim 6 wherein said biasing field effect transistor is a type-N FET connected between said source of power and base terminals of said restore bipolar transistors.

8. A memory circuit according to claim 5 wherein
said restore circuit further comprises equalizing means coupled between said cell terminals for equalizing their voltages, said equalizing means being an FET activated by the inverted state of the activation signal; and in each of said write circuits, said second field-effect transistor of said base drive circuit of said write circuit is connected across a base-emitter junction of said bipolar transistor of said write circuit for essentially shorting out said bipolar transistor of said write circuit.

9. A memory circuit according to claim 8 wherein a gate terminal of said second field-effect transistor of said base drive circuit of each of said write circuits is connected to a collector terminal of said bipolar transistor of said write circuit.

* * * * *

UNITED STATES PATENT AND TRADEMARK OFFICE
CERTIFICATE OF CORRECTION

PATENT NO. : 5,257,227

DATED : October 26, 1993

INVENTOR(S) : Klimanis et al.

It is certified that error appears in the above-identified patent and that said Letters Patent is hereby corrected as shown below:

IN THE CLAIMS:

In claim 1, col. 8, line 32, after "cell" insert --terminals for driving electric current through said second cell--.

Signed and Sealed this

Sixteenth Day of May, 1995

Attest:

BRUCE LEHMAN

Attesting Officer

Commissioner of Patents and Trademarks